United States Patent [19]
Kuenast

[11] Patent Number: 5,027,369
[45] Date of Patent: Jun. 25, 1991

[54] RAPID CONVERGENCE DECISION FEEDBACK EQUALIZER

[75] Inventor: Walter U. Kuenast, Austin, Tex.
[73] Assignee: Motorola, Inc., Schaumburg, Ill.
[21] Appl. No.: 498,655
[22] Filed: Mar. 26, 1990
[51] Int. Cl.⁵ .............................................. H03H 7/30
[52] U.S. Cl. ...................................... 375/14; 375/101
[58] Field of Search ...................... 375/13, 14, 99, 101, 375/57; 379/411; 370/32.1; 341/200

[56] References Cited
U.S. PATENT DOCUMENTS
4,695,969 9/1987 Shollenberger ................... 375/13 X Primary Examiner—Benedict V. Safourek
Assistant Examiner—Tesfaldet Bocure
Attorney, Agent, or Firm—Robert L. King

[57] ABSTRACT

A communications system receives data which is transmitted in pulse form but which is distorted by a communications medium and quantizes the data. Due to the distortion, a quantization error exists. A Decision Feedback Equalizer (DFE) is used to remove the error thru a convergence technique. The DFE has two separate portions which each function as an individual DFE having a different number of taps and different adaptive tap sizes. A first DFE portion operates alone to rapidly coverge the measured error to a predetermined threshold. A control circuit is used to determine when the threshold is reached and to activate the second DFE portion for rapid further error convergence.

9 Claims, 3 Drawing Sheets

| MODE | OUTPUT DECISION | B0 | B1 | MUXs 32&44 | MUXs 56&72 | MUXs 80&81 |
|---|---|---|---|---|---|---|
| RESET | DON'T CARE | DON'T CARE | DON'T CARE | 0 | 0 | 0 |
| COARSE | >0 | LARGE/ FAST OPERATION | 0 | UPDATE | 0 | 0 |
| FINE | <0 | SMALL/ SLOW OPERATION | SMALL/ SLOW OPERATION | UPDATE | UPDATE | ACCU- MULATE |

RAPID CONVERGENCE DECISION FEEDBACK EQUALIZER

TECHNICAL FIELD

This invention relates to telecommunications, and more particularly, to adaptive equalizers.

BACKGROUND OF THE INVENTION

Equalizers are commonly used in communication systems at a receive end of a communication transmission. Data which is transmitted in pulse form is subject to distortion by a transmission medium which results in the pulse being spread apart. The pulse distortion results in some of the signal energy of one pulse being spread into the signal energy of an adjacent pulse, thereby resulting in an error signal. The portion of the signal energy which is spread into a subsequent pulse is known as a post cursor waveform. Equalizers are used to compensate for this effect by reshaping the distortions to reform the pulse shape into its original form. Many different types of equalizers exist, and one of the general types of known equalizers is a decision feedback equalizer (DFE). Decision feedback equalizers function in a feedback path with a quantization circuit which receives an input pulse and quantizes or evaluates it signal energy. A decision feedback equalizer functions to recreate the pulse post cursor distortion, known as inter-symbol interference (ISI), and repetitively subtract the ISI from the received distorted pulse signal with the result converging to provide a compensated pulse shape. Conventional decision feedback equalizers suffer from error propagation during an initial convergence time period. That is, during the convergence time period a large number of errors are made and continue to be made before a reduction in the number of errors occurs. An example of a conventional use of a DFE in a transceiver is described by M. Arai et al. in an article entitled "Design Techniques And Performance Of An LSI-Based 2B1Q Transceiver", at the IEEE 1988 Globecom Proceedings, pgs. 25.2.1 thru 25.2.5. A solution to reduce DFE error propagation and instability resulting from ISI which is taught by Arai et al. is the use of multiple-tap filters having predetermined transfer functions to reshape the distorted pulse. Known solutions to improve convergence periods in DFEs typically require a significant amount of additional circuitry to be added into the circuitry.

SUMMARY OF THE INVENTION

Accordingly, it is an object of the present invention to provide an improved decision feedback equalizer (DFE).

Another object of the present invention is to provide an improved method and circuit for implementing decision feedback equalization.

In carrying out the above and other objects of the present invention, there is provided, in one form, a communications system for receiving input data pulses which are distorted in shape as a result of transmission. The system comprises an adder having a first input for receiving the input data pulses and a second input for receiving a feedback signal. The adder sums the two inputs and provides an output. A quantizer receives the output of the adder and provides an indication of signal power of the received input data pulses. However, the output of quantizer contains an error component. A DFE is coupled between the output of the quantizer and the second input of the adder to provide the feedback signal which causes the error component to converge to a nominal value. The DFE has first and second portions. The first portion operates without the second portion during a first time period with a large adaptive step size to rapidly convolve the error component to a predetermined threshold value. The first and second portions operate during a second time period with smaller adaptive step sizes to further rapidly convolve the error component to a small value. A control portion controls the timing of the first and second time periods by detecting when the error component reaches either an absolute value or a value which is relative to a second value.

These and other objects, features, and advantages, will be more clearly understood from the following detailed description taken in conjunction with the accompanying drawings.

DETAILED DESCRIPTION OF THE INVENTION

Figure 1:
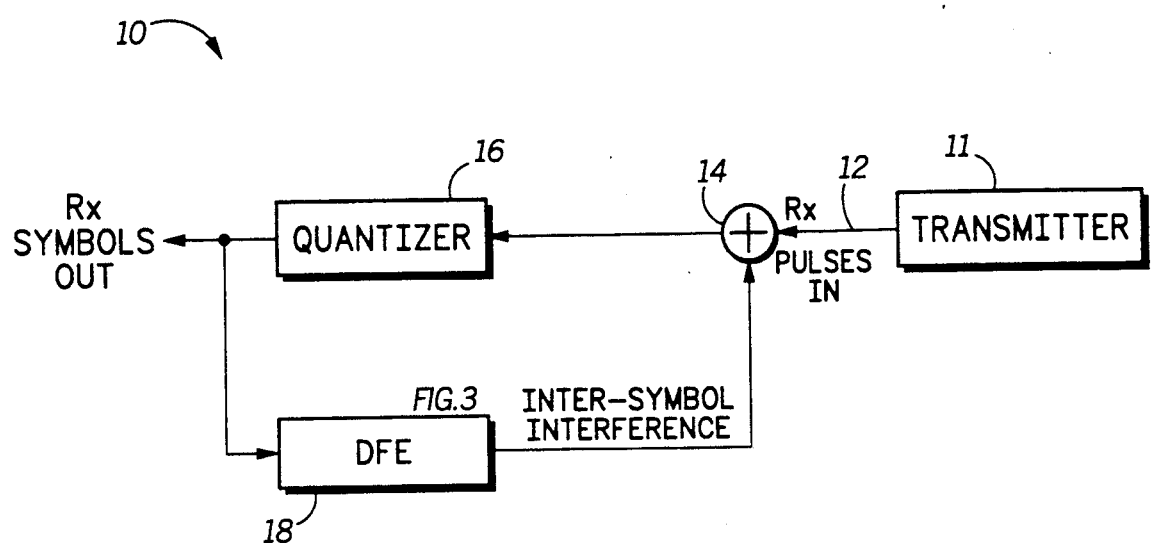
FIG. 1 illustrates in block diagram form a known communications receiver.

Shown in FIG. 1 is a known communications system 10 wherein a transmitter 11 transmits information in the form of signal pulses via a transmission line 12. Transmission line 12 provides a plurality of receive (Rx) pulses to a first input of an adder 14. An output of adder 14 is connected to an input of a quantizer 16. An output of quantizer 16 provides the receive data or receive symbols in modified form. An output of quantizer 16 is connected to an input of a decision feedback equalizer (DFE) 18. An output of DFE 18 which provides an inter-symbol interference (ISI) signal is connected to a second input of adder 14.

Figure 2:
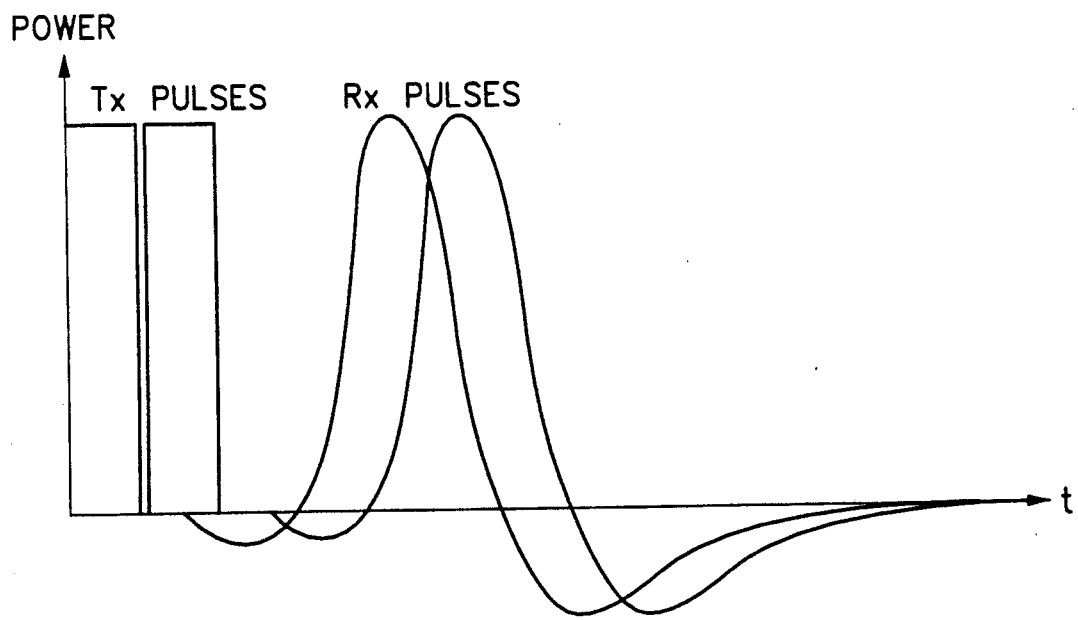
FIG. 2 illustrates in graphical form signals associated with the receiver of FIG. 1.

In operation, data is transmitted in analog form as transmit (Tx) pulses from transmitter 11 to the first input of adder 14. Because of the impedance of transmission line 12, the pulses actually received at the first input of adder 14 are distorted and have inter-symbol interference. Shown in FIG. 2 is an illustration of the Tx pulses as transmitted by transmitter 11 and the Rx signal actually received by adder 14. The pulses which are provided by transmitter 11 may be approximated as somewhat rectangular as shown in FIG. 2. After being attenuated and distorted by transmission line 12, the Rx signal has a shape substantially as shown in FIG. 2. Note that the power of each pulse is spread out with respect to time and overlapping between symbols or data values occurs. Each Rx signal corresponding to a Tx pulse has a pre-cursor and a post-cursor portion. The overlapping of the Rx pulses results in erroneous symbol decisions by a quantizer circuit such as quantizer 16. The first or pre-cursor portion of each Rx pulse typically does not result in any significant error, but the post-cursor portion does. Therefore, an equalization circuit is needed to remove the error from the output of quantizer 16 caused by signal line distortion.

As illustrated in FIG. 1, DFE 18 is utilized in a feedback path between the output and input of quantizer 16. In the illustrated form, DFE 18 functions to accurately recreate the inter-symbol interference (ISI) which is subtracted out of or removed from the received Rx pulses by adder 14 by adding a two's complement value. Initially, error remains in the power measurement made by quantizer 16. DFE 18 will adapt its coefficients resulting in a small, but acceptable, error margin with which quantizer 16 is able to provide an accurate output. However, the time required to achieve convergence may be very long resulting in an unacceptably long startup time for the communications system.

Figure 3:
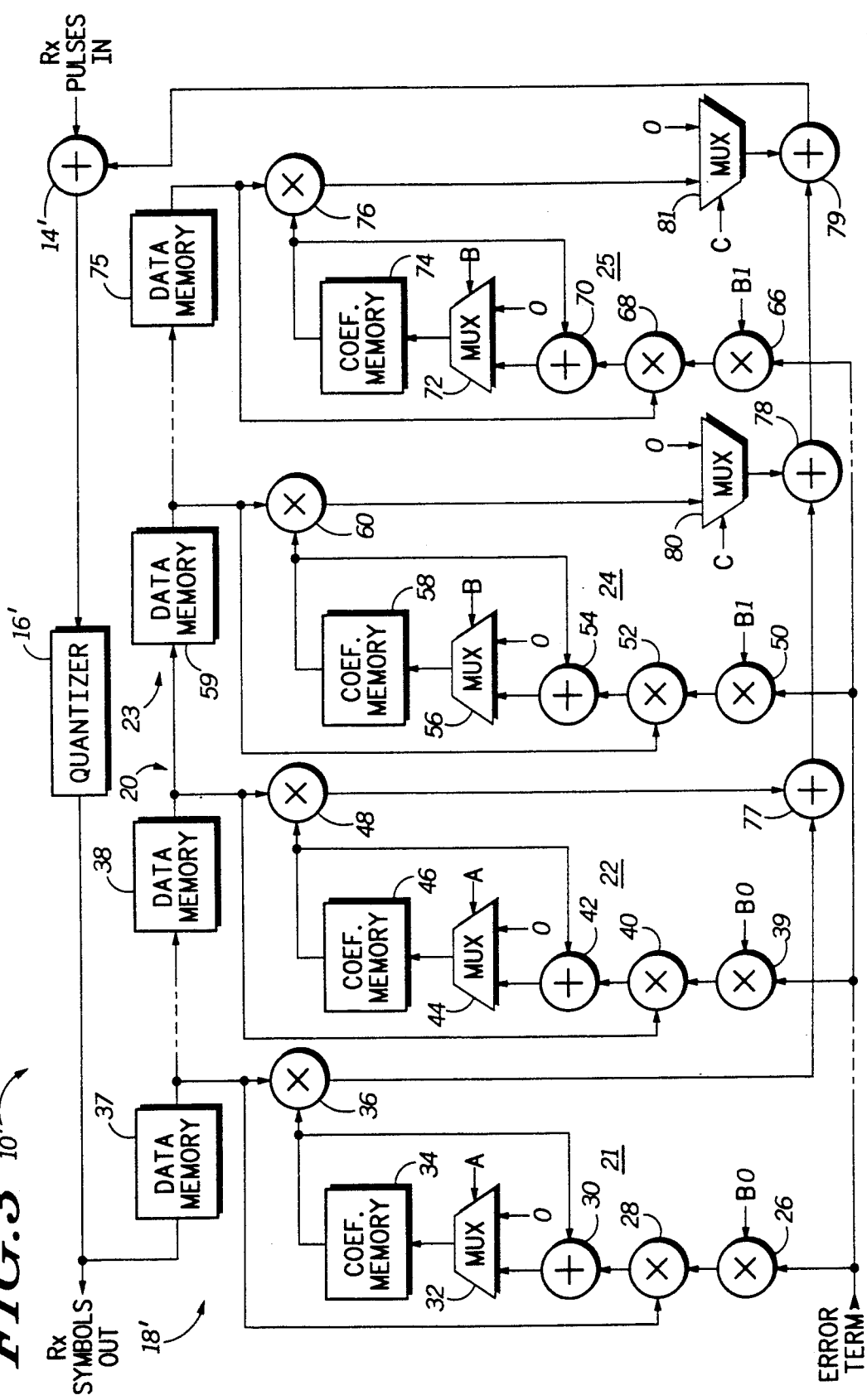
FIG. 3 illustrates in block diagram form a decision feedback equalizer in accordance with the present invention.

Shown in FIG. 3 is a communications system 10' which is a modification of communications system 10 of FIG. 1. Receive input data is connected to a first input of an adder 14'. An output of adder 14' is connected to an input of a quantizer 16'. An output of quantizer 16' provides a quantized or modified form of the receive input data. A DFE 18' in accordance with the present invention is connected between the output of quantizer 16' and a second input of adder 14'. Generally, DFE 18' comprises a first portion 20 having a first predetermined number of taps and a second portion 23 having a second predetermined number of taps. In the illustrated form, first portion 20 has two taps, taps 21 and 22, and second portion 23 also has two taps, taps 24 and 25.

Within tap 21, a multiplier 26 has a first input for receiving an error term. A second input of multiplier 26 receives a tap adaption step size B0. An output of multiplier 26 is connected to a first input of a multiplier 28. An output of multiplier 28 is connected to a first input of an adder 30. An output of adder 30 is connected to a first input of a multiplexer 32. A zero operand value is connected to a second input of multiplexer 32, and a control signal labeled "A" is connected to a control input of multiplexer 32. An output of multiplexer 32 is connected to an input of a coefficient memory 34. An output of coefficient memory 34 is connected to both a second input of adder 30 and a first input of a multiplier 36. A data memory 37 has an input connected to the output of quantizer 16' and an output connected to both a second input of multiplier 36 and a second input of multiplier 28. Tap 22 is connected to tap 21 via a data memory 38 which has an input connected to the output of data memory 37. One or more taps may be coupled between taps 21 and 22 as noted by the broken lines in FIG. 3.

Within tap 22, a multiplier 39 has a first input for receiving the error term. A second input of multiplier 39 receives adaption step size value B0. An output of multiplier 39 is connected to a first input of multiplier 40. An output of multiplier 40 is connected to a first input of an adder 42. An output of adder 42 is connected to a first input of a multiplexer 44. A second input of multiplexer 44 is connected to a zero operand value, and a control input of multiplexer 44 is connected to control signal A. An output of multiplexer 44 is connected to an input of a coefficient memory 46. An output of coefficient memory 46 is connected to both a first input of a multiplier 48 and a second input of adder 42. An output of data memory 38 is connected to both a second input of multiplier 40 and a second input of multiplier 48.

Within tap 24, a multiplier 50 has a first input for receiving the error term. A second input of multiplier 50 receives an adaption step size B1. An output of multiplier 50 is connected to a first input of a multiplier 52, and an output of multiplier 52 is connected to a first input of an adder 54. An output of adder 54 is connected to a first input of a multiplexer 56. A second input of multiplexer 56 is connected to a zero operand value, and a control input of multiplexer 56 is connected to a control signal labeled "B". An output of multiplexer 56 is connected to an input of a coefficient memory 58. An output of data memory 38 is connected to an input of a data memory 59. An output of coefficient memory 58 is connected to a first input of a multiplier 60 and to a second input of adder 54. An output of data memory 59 is connected to a second input of multiplier 60.

Within tap 25, a multiplier 66 has a first input for receiving the error term. A second input of multiplier 66 receives the adaption step size value B1. An output of multiplier 66 is connected to a first input of a multiplier 68. An output of multiplier 68 is connected to a first input of an adder 70. An output of adder 70 is connected to a first input of a multiplexer 72, and a zero operand value is connected to a second input of multiplexer 72. A control input of multiplexer 72 is connected to control signal B. An output of multiplexer 72 is connected to an input of coefficient memory 74. An output of data memory 59 is connected to an input of a data memory 75. In the illustrated form, second portion 23 has two taps 24 and 25, but may have any predetermined number as indicated by the dashed lines in FIG. 3. An output of coefficient memory 74 is connected to both a first input of a multiplier 76 and a second input of adder 70. An output of data memory 75 is connected to both a second input of multiplier 76 and a second input of multiplier 68.

An adder 77 has a first input connected to an output of multiplier 36 and has a second input connected to an output of multiplier 48. An output of adder 77 is connected to a first input of an adder 78. An output of multiplier 60 is connected to a first input of a multiplexer 80. A zero operand value is connected to a second input of multiplexer 80, and a control signal labeled "C" is connected to a control input of multiplexer 80. An output of multiplexer 80 is connected to a second input of adder 78. An output of adder 78 is connected to a first input of an adder 79. An output of multiplier 76 is connected to a first input of a multiplexer 81. A zero operand value is connected to a second input of multiplexer 81, and an output of multiplexer 81 is connected to a second input of adder 79. An output of adder 79 is connected to a second input of adder 14'.

In operation, decision feedback equalizer (DFE) 18' functions to quickly equalize receive (Rx) pulses which are received at the first input of adder 14'. Initially, the shape and content of the incoming data is totally unknown. Therefore, in order for DFE 18' to accurately recreate intersymbol interference to be subtracted out of the received data by adder 14', DFE 18' must be trained or adapted to the incoming data as an adaptive filter. To perform this function, the conventional Least-Mean-Squares (LMS) algorithm may be utilized by DFE 18'. The LMS algorithm involves a plurality of update and convolution operations. Within tap 21 the update operation is performed by multipliers 26 and 28, adder 30, multiplexer 32 and coefficient memory 34. The same is analogously true for the hardware associated with each of taps 22, 24 and 25. The convolution operation is implemented by adders 77–79 and multipliers 36, 48, 60 and 76.

To obtain a rapid convergence time, DFE 18' of FIG. 3 operates in both a coarse mode and a fine mode of operation to achieve the advantages of the present invention. Although two modes of operation are described, it should be well understood that additional modes of operation may be utilized. In the coarse mode, only first portion 20 of DFE 18' is functional. First portion 20 has a predetermined number of taps each using a large adaptive step size value B0. A large valued adaptive step size permits fast coarse adaption which significantly reduces the error at the output of quantizer 16'. Once a certain level of error reduction is achieved, the fine mode of operation is entered by DFE 18'. In the fine mode of operation, second portion 23 is allowed to operate in combination with first portion 20. In this mode, an additional number of taps are added to DFE 18'. Additionally, the adaptive step sizes of portions 20 and 23 are differing or equally small values which result in slow, refined error correction at the output of quantizer 16'. First and second portions 20 and 23 effectively operate as two decision feedback equalizers within DFE 18' with each portion having separate update and convolution operations.

Figures 4, 5:
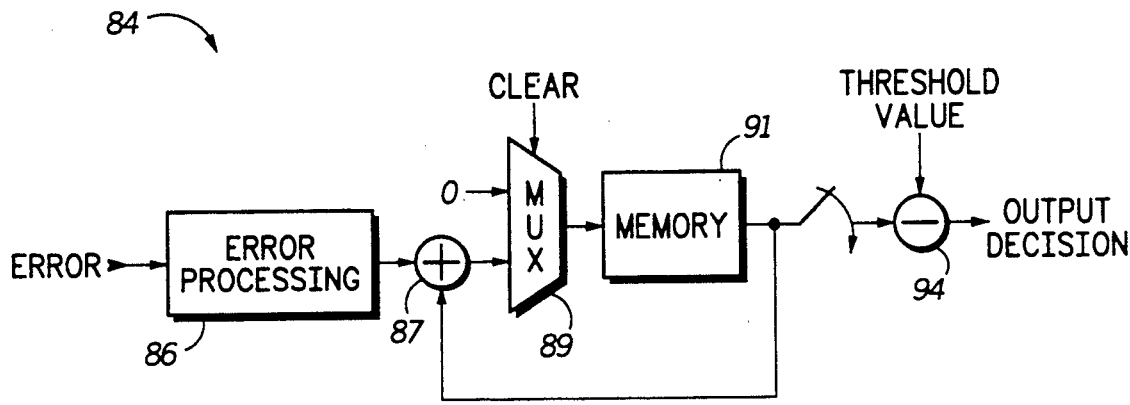
FIG. 4 illustrates in block diagram form a control circuit for use with the equalizer of FIG. 3.
FIG. 5 illustrates in table form control signals generated in response to an output of the control circuit of FIG. 4.

Shown in FIG. 4 is a control circuit 84 for use with communications system 10' of FIG. 3. Control circuit 84 functions to determine when second portion 23 of DFE 18' is made operational to operate with first portion 20. An error processing circuit 86 has an input for receiving an error signal, and an output connected to a first input of an adder 87. An output of adder 87 is connected to a first input of a multiplexer 89. A zero operand value is connected to a second input of multiplexer 89, and an output of multiplexer 89 is connected to an input of a memory 91. An output of memory 91 is connected to a second input of adder 87 and is selectively coupled to a first input of a subtracter 94. A second input of subtracter 94 is connected to a threshold value. An output of subtracter 94 provides an output decision signal.

In operation, an error indicative of the error at the output of quantizer 16' is coupled to the input of error processing circuit 86. Generation of the error term itself may be done by any one of several known error generation methods and is not described herein in detail. One technique is to connect the output of quantizer 16' to an adaptive reference compensation circuit which uses compensation to provide a corrected receive signal. A form of the corrected receive signal is subtracted from the actual input of quantizer 16' to provide the error signal. However, other known techniques may be utilized to provide the error signal. In one form, error processing circuit 86 may be implemented with a conventional absolute value circuit. Therefore, the absolute value of the error term is connected to the first input of adder 87. Adder 87, multiplexer 89 and memory 91 collectively function to sum all of the error terms over a predetermined time period. Initially, the sum stored by memory 91 is reset to zero by the Clear signal. The summation of errors is selectively connected to subtracter circuit 94 which subtracts a predetermined value which may be either an absolute threshold value or a value relative to a second value such as, for example, a percentage of previous error. The result of subtracter 94 is an output decision which determines whether DFE 18' is in the coarse or fine mode of operation. It should be noted that the threshold value connected to subtracter 94 may be implemented as either a fixed or a variable relative value.

Shown in FIG. 5 is a table which further illustrates the operation of DFE 18' of FIG. 3. Initially, DFE 18' is placed in a Reset mode by controlling multiplexers 32, 44, 56, 72, 80 and 81 to provide zero values at the output of each multiplexer. The values of adaption step sizes B0 and B1 and the output of control circuit 84 are irrelevant in the Reset mode. Each of coefficient memories 34, 46, 58 and 74 is reset to zero. The outputs of multipliers 36, 48, 60 and 76 are zero and the output of adder 79 is zero. The data values in data memories 37, 38, 59 and 75 are irrelevant.

After the Reset mode, the Coarse mode is entered by enabling first portion 20 and disabling second portion 23. First portion 20 is enabled by control signal A which allows multiplexers 32 and 44 to perform update filtering calculations by respectively outputting the outputs of adders 30 and 42. Control signal B forces multiplexers 56 and 72 to output a zero, and control signal C forces multiplexers 80 and 81 to output a zero. As previously mentioned, adaptive step size B0 is a large value. Adaptive step size B1 is zero during the Coarse mode. Data is outputted by quantizer 16' and time shifted thru data memories 37, 38, 59 and 75. Each of taps 21 and 22 repetitively form convolution product sequence values at the outputs of multipliers 36 and 48, respectively. Adder 77 forms a partial convolution accumulation value by adding the outputs of multipliers 36 and 48 and couples the sum to the second input of adder 14' via adders 78 and 79. Multiplexers 80 and 81 are respectively coupling zero values to adders 78 and 79. Initially, a large amount of error exists in the output of quantizer 16'. However, use of only a portion of the total number of taps and use of large adaptive step values provides rapid convergence to a lower error level. Taps 21 and 22 function together in performing conventional update calculations associated with the LMS algorithm during the Coarse mode of operation until the error in the output of quantizer 16' falls below the predetermined threshold value as determined by control circuit 84 upon which the output decision signal changes polarity and the Fine mode of operation is entered. At this point in the Coarse mode of operation, taps 21 and 22 are converged until the adaption error falls below a threshold.

In the Fine mode of operation, both first portion 20 and second portion 23 of DFE 18' are operative. Control signals A, B and C function to respectively make multiplexers 32, 44 and 56, 72 and 80, 81 operational. Multiplexers 32, 44, 56 and 72 are controlled to allow update calculations to be implemented, and multiplexers 80 and 81 respectively allow adders 78 and 79 to accumulate and implement the convolution calculations of the conventional LMS algorithm. Additionally, a small adaptive step size is used for both B0 and B1 which results in slower but more refined convergence of the error remaining in the output of quantizer 16'. The larger number of taps which exist in DFE 18' when second portion 23 is made operational with first portion 20 allows a larger area of the Inter-Symbol Interference to be measured and compensated for. It should be noted that data is allowed to propagate thru second portion 23 even when second portion 23 is not operatively functioning in order to maintain proper data tap alignment.

The number of taps defined in each of first portion 20 and second portion 23 may be desirable to be different. Whether a larger number of taps in the second portion than the first portion is preferable depends upon a particular DFE application.

Another aspect of the present invention involves error reconvergence of communications system 10′ after timing phase jumps in the received data. Should the received input pulses have a change in phase, significant error will again be present in the output of quantizer 16′. Therefore, both or either of the coarse and fine modes of operation of error convergence may be executed as described above without the use of a Reset signal. In other words, coefficient memories 34, 46, 58 and 74 are not cleared when convergence error is removed in response to a timing phase jump.

By now it should be apparent that a decision feedback equalizer which may be considered as two individual DFEs operating together is provided for fast error convergence in a communications system. Each of the circuit portions 20 and 23 has separate update, convolution and memory control circuitry. Control circuitry is provided to control the operation of each DFE portion. As a result of using separate adaptive step values Bi in different DFE structures, error propagation is reduced thereby minimizing convergence time.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A communications system for receiving input data pulses which are distorted in shape as a result of transmission, comprising:
    combining means having a first input for receiving the input data pulses and a second input for receiving a feedback signal, said combining means combining the feedback signal and the data pulses to provide an output;
    quantization means coupled to the combining means for receiving the output of the combining means and quantizing said output signal to provide at an output thereof an indication of signal power of the received input data pulses, said indication having an error component;
    feedback means coupled between the second input of the combining means and the output of the quantization means for providing the feedback signal which when combined with the input data pulses causes the error component to converge to a nominal value, said feedback means having first and second coefficient tap portions, said first coefficient tap portion having a first predetermined number of taps and operating without the second coefficient tap portion during a first time period to provide the feedback signal, said second coefficient tap portion having a second predetermined number of taps, and said first and second coefficient tap portions operating together during a second time period to provide the feedback signal; and
    control means coupled to the feedback means for controlling lengths of the first and second time periods in response to the error component.

2. The communications system of claim 1 wherein said feedback means is an adaptive filter, said first coefficient tap portion using a first adaptive step value for controlling, in part, how rapidly the adaptive filter causes the error component to converge to the nominal value, and said second coefficient tap portion using a second adaptive step value for also controlling how rapidly the adaptive filter causes the error component to converge to the nominal value.

3. The communications system of claim 2 wherein the first adaptive step size is large during the first time period relative to during the second time period.

4. The communications system of claim 1 wherein said combining means is an adder.

5. The communications system of claim 1 wherein said control means further comprise:
    an error processing circuit having an input for receiving the error component of the output of the quantization means, said error processing circuit providing an absolute value of the error component;
    summation means coupled to the error processing circuit for summing and storing a plurality of error component values over a predetermined time frame to provide a summation output; and
    comparison means coupled to the summation means for selectively comparing the summation output with a predetermined threshold value to provide a control signal having a value which determines the length of the first and second time periods.

6. A decision feedback equalizer (DFE) for use in a feedback loop between the output of a quantizer for quantizing received data and an adder which adds an output of the DFE to the received data for the purpose of converging an error in the output of the quantizer to a minimal value, said DFE comprising:
    a first tap portion having a first predetermined number of filter taps, each filter tap of the first tap portion operating during a first time period with a first adaptive step value to update and convolve the error and during a second time period following the first time period with a second adaptive step value smaller in magnitude than the first adaptive step value, said first and second adaptive step values controlling how rapidly the adaptive filter causes the error to converge to the minimal value;
    a second tap portion having a second predetermined number of filter taps, each filter tap of the second tap portion operating only during the second time period, said second tap portion coupled to the first tap portion to collectively further update and convolve error remaining after the first time period; and
    control means for controlling lengths of the first and second time periods in response to the error in the output of the quantizer.

7. The communications system of claim 6 wherein said control means further comprise:
    an error processing circuit having an input for receiving the error in the output of the quantization means, said error processing circuit providing an absolute value of the error;
    summation means coupled to the error processing circuit for summing and storing a plurality of error component values over a predetermined time frame to provide a summation output; and
    comparison means coupled to the summation means for selectively comparing the summation output with a predetermined threshold value to provide a control signal having a value which determines the length of the first and second time periods.

8. A method of rapidly converging an error in a data output of a quantization circuit in a communications system with decision feedback equalization, comprising the steps of:

using a first predetermined number of adaptive filter taps with a first adaptive step size which controls, in part, how rapidly the error converges, the first number of adaptive filter taps functioning to quickly converge the error to a predetermined threshold value;

detecting when the error has reached the predetermined threshold value; and using a second predetermined number of adaptive filter taps with a second adaptive step size smaller than the first adaptive step size in response to said detecting to further converge the error, said second adaptive filter size further controlling how rapidly the error converges.

9. The method of claim 8 further comprising the step of: making the second predetermined number greater than the first predetermined number.

* * * * *